United States Patent [19]
Selcuk

[11] Patent Number: 6,130,470
[45] Date of Patent: *Oct. 10, 2000

[54] STATIC RANDOM ACCESS MEMORY CELL HAVING BURIED SIDEWALL CAPACITORS BETWEEN STORAGE NODES

[75] Inventor: Asim A. Selcuk, Cupertino, Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/823,081

[22] Filed: Mar. 24, 1997

[51] Int. Cl.$^7$ ...................................................... H01L 27/11
[52] U.S. Cl. .......................... 257/534; 257/532; 257/903; 257/904
[58] Field of Search .................................. 257/66, 67, 69, 257/379, 380, 381, 903, 904, 532, 534; 365/154, 174, 188

[56] References Cited

U.S. PATENT DOCUMENTS

| | | |
|---|---|---|
| 4,987,090 | 1/1991 | Hsu et al. . |
| 5,040,036 | 8/1991 | Hazani . |
| 5,252,506 | 10/1993 | Carter et al. . |
| 5,292,678 | 3/1994 | Dhong et al. ............................. 437/50 |
| 5,459,686 | 10/1995 | Saito . |
| 5,483,083 | 1/1996 | Meguro et al. . |
| 5,487,044 | 1/1996 | Kawaguchi et al. . |
| 5,489,790 | 2/1996 | Lage . |
| 5,550,396 | 8/1996 | Tsutsumi ................................ 257/330 |
| 5,699,289 | 12/1997 | Takenaka . |
| 5,708,621 | 1/1998 | Tanoi . |
| 5,792,686 | 8/1998 | Chen et al. ............................. 438/244 |

FOREIGN PATENT DOCUMENTS 60-140854   7/1985   Japan .

*Primary Examiner*—Jerome Jackson, Jr.
*Assistant Examiner*—Bradley William Baumeister
*Attorney, Agent, or Firm*—Foley & Lardner

[57] ABSTRACT

A static random access memory (SRAM) cell having increased cell capacitance at the storage nodes utilizes a capacitive structure disposed in a trench. The capacitive structure includes an oxide liner disposed underneath two polysilicon plates. The polysilicon plates are each connected to drains of lateral transistors associated with the SRAM cell. The capacitive plates are deposited as a conformal layer polysilicon and then anisotropically etched to form plates on the side walls of the trench. A dielectric material such as silicon dioxide may be deposited between the polysilicon plates in the trench. The capacitor structures are provided between first and second N-channel pull down transistors associated with the SRAM cell.

19 Claims, 4 Drawing Sheets

STATIC RANDOM ACCESS MEMORY CELL HAVING BURIED SIDEWALL CAPACITORS BETWEEN STORAGE NODES

CROSS REFERENCE TO RELATED CASES

The present application is related to U.S. application Ser. No. 08/822,518 entitled, "A Memory Cell Having Increased Capacitance Via A Local Interconnect To Gate Capacitor And A Method For Making Such A Cell," filed by Kepler et al. on an even date herewith. The present application is also related to U.S. application Ser. No. 08/823,817 entitled, "A Static Random Access Memory Cell Having A Trench Field Plate For Increased Capacitance And A Method For Making Such A Cell," filed by Lee et al. on an even date herewith.

FIELD OF THE INVENTION

The present invention relates generally to integrated circuit devices having enhanced capacitance. More particularly, the present invention relates to an SRAM cell having enhanced capacitance.

BACKGROUND OF THE INVENTION

Semiconductor memory devices such as random access memory (RAM) devices typically include a number of memory cells coupled to at least one bit line. The memory cells often include at least one storage transistor, storage node, and pass gate transistor. Generally, two storage transistors are coupled between two pass gate transistors, and a bit line is coupled to each of the pass transistors. Thus, each memory cell is often located between two bit lines.

The pass gate transistors have gate electrodes which are coupled to word lines. A signal such as an address or select signal is provided on the word line associated with the memory cell to select or access a particular memory cell. Once the memory cell is selected via the word line, the memory cell can be read or written to through the pass gate transistors via the bit lines.

Semiconductor memory cells include static RAM devices (SRAMs). The memory cell of the SRAM often contains two inverters connected in anti-parallel. Basically, each cell is a flip-flop which has two stable states (e.g., a logic 1 or a logic 0). The memory cell is generally made of four or six transistors. In a four transistor SRAM cell, a first resistor is coupled in series with a first pull down (e.g., storage or drive) transistor at a first storage node, and a second resistor is coupled in series with a second pull down transistor at a second storage node. A first pass gate is coupled between a first bit line and the first storage node, and a second pass gate is coupled between a second bit line and a second storage node.

In a six transistor memory cell, the first and second resistors are replaced by first and second load transistors. The load transistors can be P-channel transistors, diodes, or depletion mode N-channel transistors or other load element. The pull down transistors and pass gate transistors for both four transistor cells and six transistor cells are often N-channel enhancement mode transistors.

As the advance of technology has increased the storage capacity of memory devices, bit lines have become longer as they connect more memory cells. The increased length of the bit line increases the capacitive and resistive effects associated with the bit line. Additionally, memory cell size has steadily decreased so more memory cells can be located on a single semiconductor substrate. The decreased memory cell size makes it more difficult for the memory cell to sink (e.g., receive) and source (e.g., supply) current as the memory cell is accessed. The current sinking and sourcing problem is enhanced by the larger capacitance and resistance associated with longer bit lines because the transmitted signal across the bit lines is dissipated across the longer length of the bit lines. For example, the memory cell must provide enough current sinking and sourcing capability to overcome the capacitance and resistance of the entire bit line before the logic level of the signal may be appropriately read from the cell or be appropriately written to the cell.

Thus, there is a need for a memory cell which has superior current sourcing and sinking characteristics. Further, there is a need for a memory cell of minimal size which can appropriately read, write, and store logic signals. Further still, there is a need for a stable memory cell of small size which is relatively immune to noise.

SUMMARY OF THE INVENTION

The present invention relates to a memory cell having an enhanced cell capacitance. The memory cell includes a portion of a semiconductor substrate, a first pull down transistor coupled to a first storage node, and a second pull down transistor coupled to a second storage node. The first pull down transistor is adjacent the second pull down transistor, and the first pull down transistor is separated from the second pull down transistor by a trench formed in the semiconductor substrate. The trench includes a first trench wall. A conductive material is disposed on the first trench wall. The conductive material enhances the capacitance associated with at least one of the first storage node or the second storage node.

The present invention also relates to a memory cell having enhanced cell capacitance. The memory cell includes a first lateral transistor formed on a semiconductor substrate, and a second lateral transistor formed on the semiconductor substrate. The first lateral transistor has a first source region disposed on a top side of the semiconductor substrate, a first drain region disposed on a top side of the semiconductor substrate, and a first gate disposed on a top side of the semiconductor substrate. The first gate is located between the first drain region and the first source region. The second lateral transistor has a second source region disposed on a top side of the semiconductor substrate, a second drain region disposed on a top side of the semiconductor substrate, and a second gate disposed on a top side of the semiconductor substrate. The second gate is located between the second drain region and the second source region. The first lateral transistor is adjacent the second lateral transistor, and the first lateral transistor is separated from the second lateral transistor by a trench formed in semiconductor substrate. The trench includes a capacitive structure. The capacitive structure enhances the capacitance associated with the memory cell.

The present invention further relates to a method of manufacturing a memory cell having plate capacitors between a first storage node and a second storage node. The memory cell includes first and second lateral transistors disposed on a semiconductor substrate. The method includes steps of forming an isolation trench in the semiconductor substrate between the first and the second lateral transistors, forming on insulative lines in the trench, depositing a conductive material in the trench and anisotropically etching the conductive material, thereby leaving the conductive material on a plurality of sidewalls on the trench.

In one aspect of the present invention, the current sourcing and seeking capabilities of an SRAM memory cell are enhanced by providing a capacitive structure within the semiconductor substrate associated with the memory cell. The capacitive structure is preferably located within a trench and is coupled to drain regions (e.g., the storage nodes of the cell) of the pull down transistors associated with the memory cell. The capacitive structure includes conductive materials provided on sidewalls of the trench and a dielectric material disposed between the conductive material. The capacitive structure enhances the capacitance associated with the memory cell.

In another aspect of the invention, the enhanced capacitance of the memory cell is schematically embodied by three capacitors. A first capacitor is located between a first storage node and ground, a second capacitor is located between the two storage nodes, and a third capacitor is located between a second storage node and ground. The capacitors allow the memory cell to operate more stably and have more noise immunity because more of a disturbance is required to substantially discharge the stored charge of the memory cell.

In yet another aspect of the present invention, a capacitor is formed by providing a conformal layer in an isolation trench between the pull down transistors of the cell. The transistors are preferably lateral transistors, and the trench has an oxide liner. The conformal layer is anisotropically etched to remove it from the bottom of the trench, thereby leaving conductive sidewalls. A strapping layer or local interconnect can be utilized to connect the conductive material on the sidewalls to the drain regions. Alternatively, the liner of the trench can be etched at the corners of the trench so the conformal layer directly contacts the drain regions, (e.g., via) or a contact already necessary for connection to the storage node can be offset to touch both the drain and the conformal layer. In another alternative, the trench may be located between two pass transistors or load transistors associated with the storage nodes.

BRIEF DESCRIPTION OF THE DRAWINGS

The invention will hereafter be described with reference to the accompanying drawings wherein like numerals denote like elements, and.

DETAILED DESCRIPTION OF THE PREFERRED EXEMPLARY EMBODIMENT OF THE PRESENT INVENTION

Figure 1:
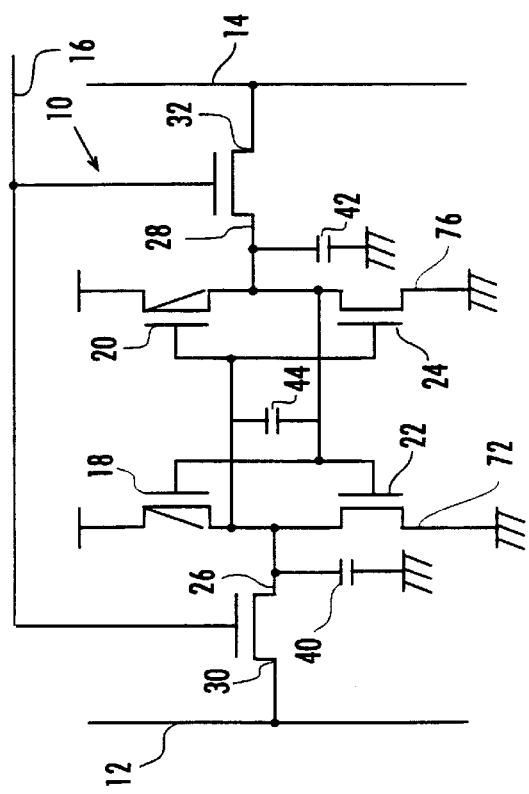
FIG. 1 is an electrical schematic drawing of a memory cell in accordance with an exemplary embodiment of the present invention.

With reference to FIG. 1, a memory cell 10 is coupled between complimentary bit lines 12 and 14 and is coupled to a word line 16. Memory cell 10 is preferably a static random access memory cell (SRAM) including a load transistor 18, a load transistor 20, a drive or pull down transistor 22 and a pull down transistor 24. Transistors 18, 20, 22, and 24 are coupled together to form cross-coupled inverters having a storage node 26 and a storage node 28.

Transistors 18 and 20 are preferably P-channel transistors, but may be replaced by polysilicon or other resistors, N-channel depletion mode transistors, or other electrical devices for raising the voltage at storage nodes 26 and 28 when pull down transistors 22 and 24 are turned OFF, respectively. Pull down transistors 22 and 24 are preferably N-channel transistors, although other types of transistors such as bipolar transistors or other devices may be utilized. Transistors 22 and 24 are preferably conventional N-channel enhancement mode transistors having a gate threshold voltage between 0.5 and 0.6 volts (V).

Storage node 26 is coupled to a pass gate transistor 30 which is controlled by word line 16. Storage node 28 is coupled to a pass gate transistor 32 which is also controlled by word line 16. Pass gate transistors 30 and 32 are preferably N-channel enhancement mode transistors having a gate threshold voltage between 0.5 and 0.60, although other types of transistors may be utilized.

In operation, cell 10 stores logic signals data, or information such as a logic 1 (e.g., VCC) or logic 0 (e.g., ground) on nodes 26 and 28. When transistor 22 is turned on, transistor 18 is turned off and node 26 is coupled to ground. When transistor 24 is turned off, transistor 20 is turned on and node 28 is coupled to VCC or power. Conversely, when transistor 22 is turned off, transistor 18 is turned on and node 26 is coupled to VCC. When transistor 24 is turned on, transistor 20 is turned off and node 28 is coupled to ground. The logic level stored on node 26 is opposite the logic level stored on node 28.

Cell 10 is accessed for reading from and writing to nodes 26 and 28 when a select signal, such as a logic 1 or VCC, is provided on word line 16. Memory cell 10 is accessed as pass gate transistors 30 and 32 couple bit lines 12 and 14 to nodes 26 and 28, respectively, in response to the select signal on word line 16.

In a read operation, cell 10 is accessed by providing the select signal on line 16. During the read operation, the signal at storage node 26 is provided to bit line 12 while the signal at storage node 28 is provided to bit line 14. The signals on lines 12 and 14 are then read by a sense amplifier (not shown).

In a write operation, cell 10 is accessed by providing the select signal on line 16. During the write operation, the signal on bit line 12 is driven to node 26 while the signal on bit line 14 is driven to node 28. After the select signal on line 16 is removed, cell 10 stores the signals driven on lines 12 and 14. Cell 10 stores the signals on nodes 26 and 28, respectively. The signals on bit lines 12 and 14 are complimentary to each other.

Storage nodes 26 and 28 must be able to receive and transmit current to receive and transmit the appropriate logic or storage signals across bit lines 12 and 14, respectively. To store more charge on nodes 26 and 28, memory cell 10 advantageously employs a capacitor 40 between storage node 26 and ground, a capacitor 42 between storage node 28 and ground, and a capacitor 44 between storage nodes 26 and 28. Capacitors 40, 42 and 44 provide superior charge storing capability and more immunity for memory cell 10. Capacitors 40, 42 and 44 allow transistors 18, 20, 22 and 24 to store more charge on storage nodes 26 and 28. Therefore, despite the small size of cell 10 and the length of lines 12 and 14, nodes 26 and 28 can provide and receive adequate logic signals on lines 12 and 14. Additionally, the enhanced capacitance increases the stability and noise immunity of cell 10.

Figure 2:
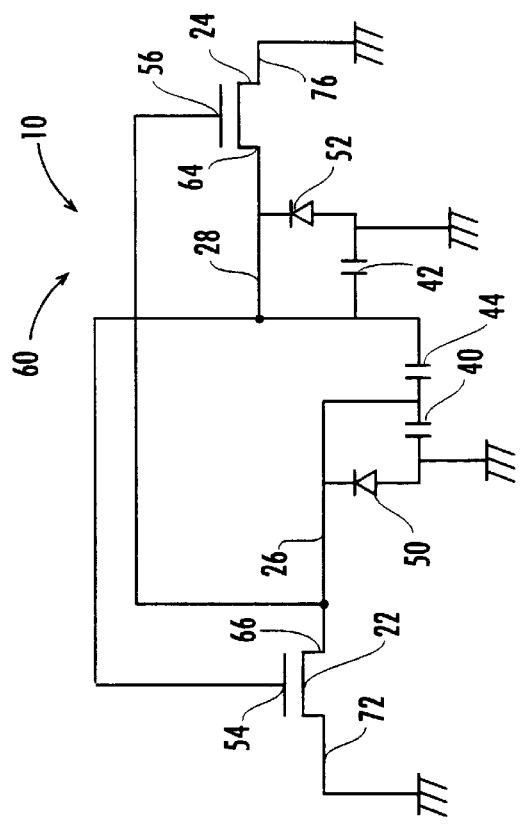
FIG. 2 is a more detailed electrical schematic drawing of a portion of the memory cell illustrated in FIG. 1 in accordance with an exemplary embodiment of the present invention.

With reference to FIG. 2, a portion 60 of cell 10 is shown for simplicity. A diode 50 disposed between ground and node 26, and a diode 52 disposed between ground and node 28. Diodes 50 and 52 are inherent structures due to the semiconductor layout of cell 10. Transistors 22 and 24 are preferably lateral transistors. Additionally, transistors 18, 20, 30 and 32 can be lateral transistors, vertical transistors, or thin film transistors. A gate 54 of transistor 22 is coupled to node 28, and a gate 56 of transistor 24 is coupled to node 26. A drain 66 of transistor 22 is coupled to node 26, and a drain 64 of transistor 24 is coupled to node 28. A source 72 of transistor 22 is coupled to ground, and a source 76 of transistor 24 is coupled to ground.

Figure 3:
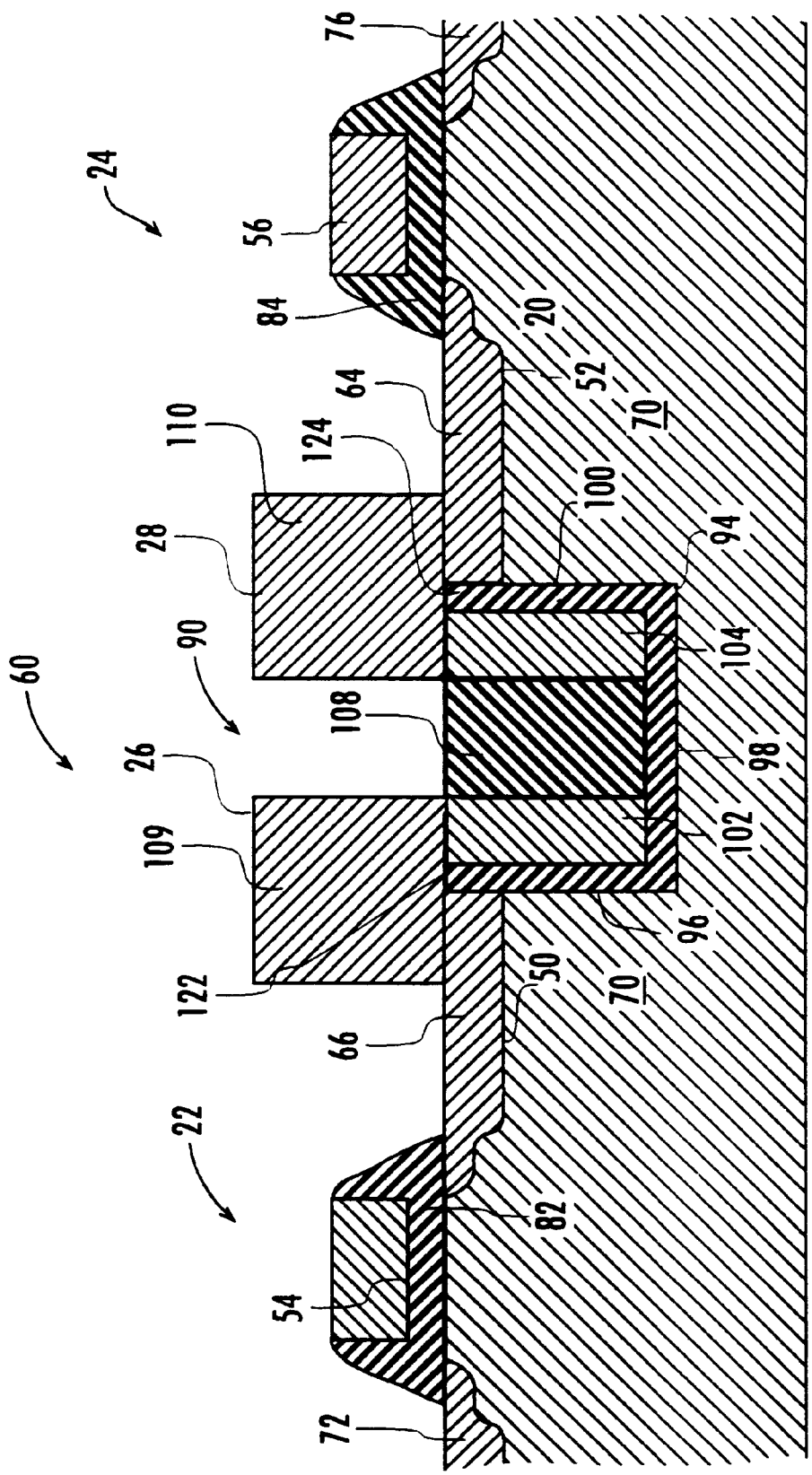
FIG. 3 is a cross-sectional view of a semiconductor substrate including the portion of the memory cell schematically illustrated in FIG. 2.

With reference to FIG. 3, a cross-sectional view of portion 60 includes transistor 22 and transistor 24. Transistor 22 is a lateral transistor formed in a semiconductor substrate 70. Transistor 22 includes drain 66, gate 54, and source 72. Similarly, transistor 24 is a lateral translator formed in substrate 70. Transistor 24 includes drain 64, gate 56, and source 76. Drains 64 and 66 as well as sources 72 and 76 are highly doped N-type regions formed in a P-type substrate such as substrate 70. Substrate 70 is coupled to ground or a substrate voltage of zero or lower volts.

Gate 54 is provided over a thin oxide layer 82, and gate 56 is provided over a thin oxide layer 84. Diode 50 is formed between drain 66 and substrate 70, and diode 52 is formed between drain 64 and substrate 70.

Portion 60 includes a capacitive structure (represented in FIGS. 1 and 2 by capacitors 40, 42 and 44) formed in an isolation trench 90 which separates drain 66 of transistor 22 from drain 64 of transistor 24. Trench 90 is preferably from 0.35 to 0.5 microns deep and 0.375 microns wide (depending upon the fabrication technique). The width of trench 90 can range from 0.18 to 1.0 microns. The capacitance associated with the capacitive structure formed in isolation trench 90 can be increased by making trench 90 narrower and deeper.

Trench 90 includes a lateral wall 96, a bottom 98 and a lateral wall 100. An insulative layer or liner 94 is formed on lateral wall 96, bottom 98 and a lateral wall 100. A conductive film 102 such as a doped polysilicon material or other conductive material is provided over liner 94 on wall 96 to form a capacitive plate between transistors 22 and 24 and to substrate 70. Additionally, a conductive film 104 such as a doped polysilicon material or film is provided over liner 94 on wall 100 to form another capacitive plate between transistors 22 and 24 and to substrate 70. Films 102 and 104 are each preferably 1000–2000 Angstroms (A) thick. Capacitor 40 is formed by film 102, liner 94 and substrate 70, and capacitor 42 is formed by film 104, liner 94 and substrate 70. The capacitance associated with the capacitive structure formed in trench 90 can be increased by increasing the thickness of films 102 and 104. Films 102 and 104 each have a width of less than one half the width of trench 90. Films 102 and 104 can be any conductor such as tungsten, silicides, aluminum, copper, titanium, or other conductive material.

A dielectric material 108 such as spin-on-glass (SOG), silicon dioxide, or other dielectric substance can be provided between films 102 and 104. Film 102 is coupled to drain 66 by a strapping layer 109 coupled to node 26. Strapping layer 109 is preferably from 1000 A to 1 micron thick and made from a conductive material such as doped polysilicon, silicide, titanium, aluminum, copper, tungsten, or other conductor. Alternatively, material 108 can be deposited when the intralevel dielectric (e.g., polysilcon to first metal) is deposited.

Alternatively, strapping layer 109 may be part of a contact (not shown) already required to contact drain 66 or node 26. For example, the contact for drain 66 may be offset to be over both drain 66, liner 94 on wall 96 and film 102. By utilizing the contact for drain 66, additional conductive layers, materials and processing steps are not required for strapping layer 109 (e.g., the connection of drain 66 to film 102).

Similarly, film 104 is coupled to drain 64 by a strapping layer 110 coupled to node 28. Strapping layers 109 and 110 provide electrical connection around liner 94 provided on walls 96 and 100. Strapping layer 110 is preferably from 1000 A to 1 micron thick and made from a conductive material such as doped polysilicon, silicide, titanium, tungsten or other conductor. Alternatively, strapping later 110 can be a portion of a contact utilized to make a connection to drain 64. Alternatively, drain 64 can be coupled to film 104 by a local interconnect (e.g., tungsten or polysilicon) or by etching oxide liner 94 so film 104 contacts drain 64. (Preferably, liner 94 is etched before layer 112 is deposited.) (FIG. 4) Similarly, film 102 can be coupled to drain 66 by a local interconnect or by etching oxide liner 94 so film 102 contacts drain 66. The capacitive structure in trench 90 forms capacitors 40, 44 and 42 discussed with reference to FIGS. 1 and 2.

Figure 4:
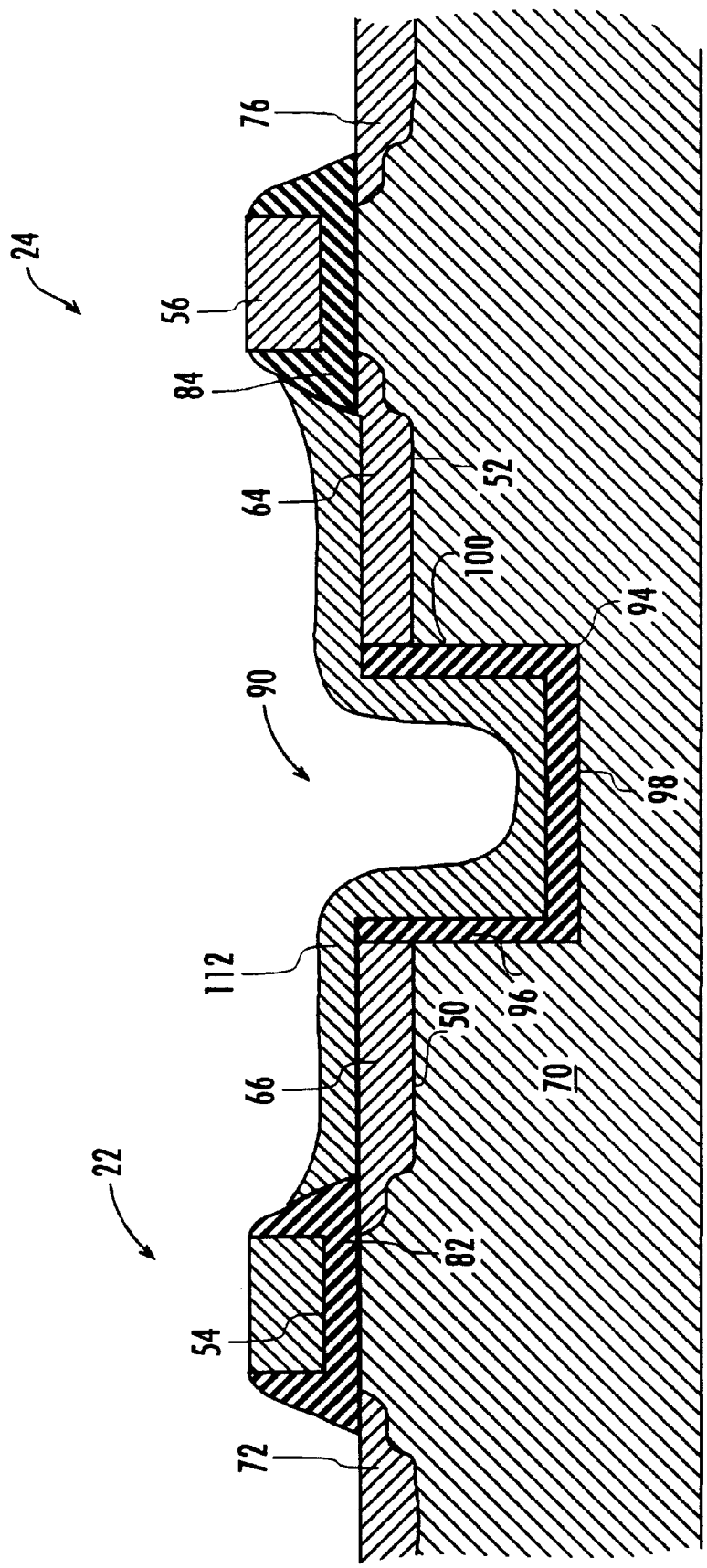
FIG. 4 is a cross-sectional view of the semiconductor substrate illustrated in FIG. 3 including a conductive conformal layer.
Figure 5:
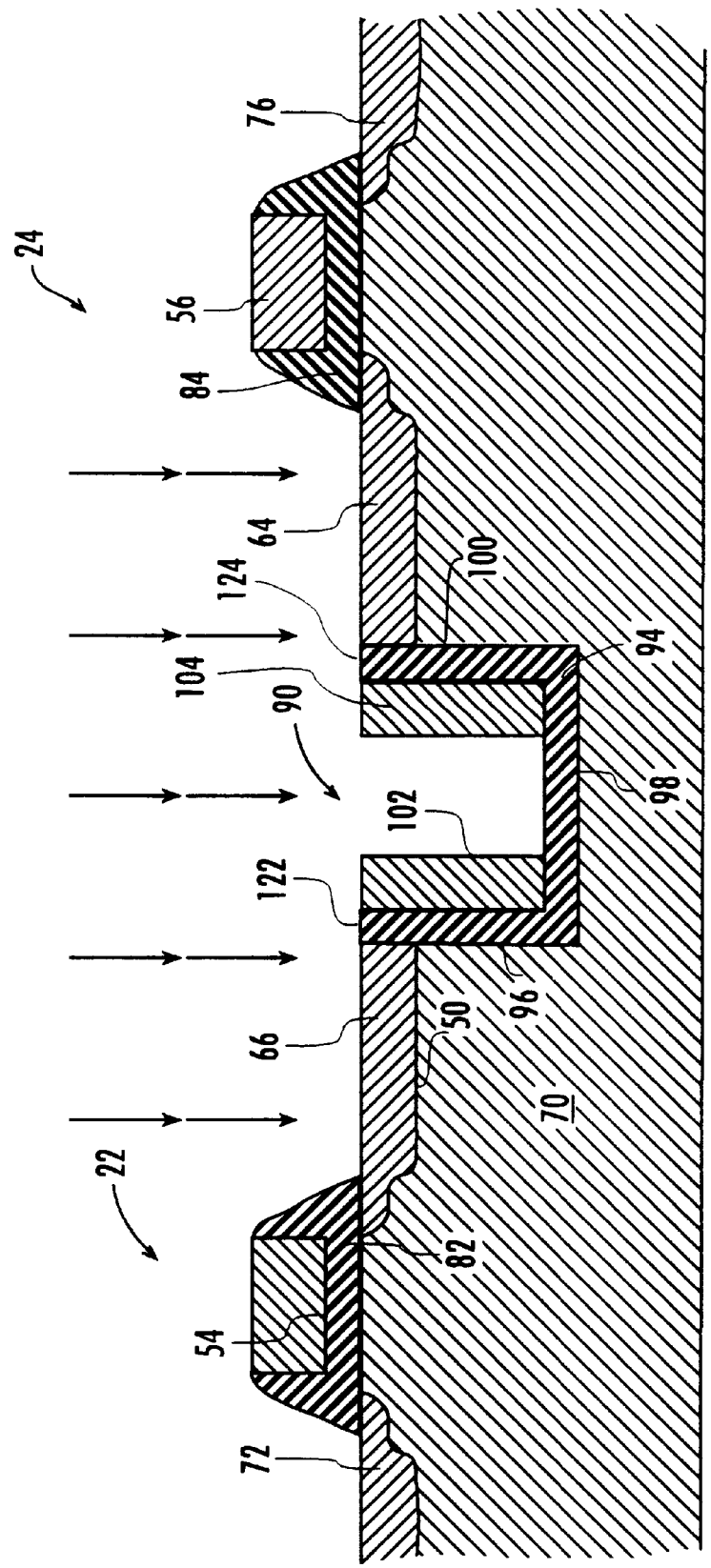
FIG. 5 is a cross-sectional view of the semiconductor substrate illustrated in FIG. 4 wherein the conductive conformal layer is partially etched to leave capacitive plates within the trench.

With reference to FIGS. 3, 4 and 5, the method of manufacturing cell 10 is described as follows In FIG. 4, portion 60 is shown having lateral transistors 22 and 24 substantially formed and trench 90 etched between drains 66 and 64. Trench 90 can be etched into substrate 70 by dry etching, wet etching or any technique for forming a trench between drains 64 and 66. After trench 90 is formed, an oxide layer can be deposited or grown to form liner 94 on wall 96, bottom 98 and wall 100 of trench 90. Liner 94 preferably has a thickness of 100 A to 300 A and can be an insulative or dielectric material such as silicon dioxide. The capacitance of the capacitive structure formed in trench 90 can be increased by thinning liner 94. After liner 94 is grown or deposited, a conformal layer 112 of a conductive material such as polysilicon is formed over trench 90. Layer 112 has a preferred thickness of 1500 A. Layer 112 is deposited by evaporating, dipping, collimated sputtering, physical vapor deposition, sputter deposition, or other deposition techniques.

Layer 112 is anisotropically etched to leave a 1500 A thick capacitive plate on walls 96 and 100 of trench 90 (FIG. 5), (e.g., films 102 and 104). Films 102 and 104 preferably have a thickness of at least 1000 A. Etching removes all of layer 112 from bottom 98 of trench 90. Etching can be by reactive ion etching (RIE), directional dry etching, planarization, laser ablation, or other etch techniques. Etching is preferably performed at an angle of 90 degrees.

After etching, a local interconnect or strapping layers 109 and 110 (FIG. 3) can be used to couple films 102 and 104 to drain 66 and 64, respectively. As an alternative to providing a strapping layer or local interconnect, liner 94 can be removed at corners 122 and 124 (FIGS. 3 and 5) of trench 90 so that films 102 and 104 directly contact drains 64 and 66, respectively. Liner 94 can be removed by any of the etching techniques described above. In a further alternative, films 102 and 104 can be coupled to drains 66 and 64, respectively, by providing an offset metal contact to drains 66 and 64.

After etching layer 112 from trench 90, trench 90 can be filled with a material 108 such as silicon dioxide, SOG, TEOS oxide, PECVD TEOS oxide, SiH$_4$ based PECVD oxide or a two layer glass and nitride material to increase the dielectric constant between films 102 and 104. Material 108 is preferably 1000 to 2000 A wide from film 102 and 104. Material 108 can be deposited by physical vapor deposition or other deposition techniques discussed above. Preferably, material 108 fills the entire space between films 102 and 104 in trench 90.

Alternatively, trench 90 may be an isolation trench between other lateral transistors such as transistors 18 and 20 or transistors 30 and 32 (FIG. 1). For example, in cells including thin film or vertical load transistors, trench 90 can be utilized between lateral pass gate transistors 30 and 32.

It is understood that, while the detailed drawings and specific examples given describe the exemplary embodiments of the present invention, they are for the purpose of illustration only. The apparatus and method of the invention is not limited to the precise details, geometries, dimensions, and conditions disclosed. For example, although particular layers are described as being particular sizes, other sizes could be utilized. Further, although polysilicon is used as the conductive film, other conductive materials may be utilized. Further, single lines and various drawings can represent multiple conductors. Various changes can be made to details disclosed without departing from the spirit of invention which is defined by the following claims.

What is claimed is:

1. A flip-flop based memory cell having enhanced cell capacitance, the memory cell comprising:
   a portion of a semiconductor substrate;
   a first pull down transistor coupled to a first storage node; and
   a second pull down transistor coupled to a second storage node, wherein the first pull down transistor is adjacent the second pull down transistor and the first pull down transistor is separated from the second pull down transistor by a trench formed in the portion of the semiconductor substrate, the trench including a first trench wall, a second trench wall spaced from the first trench wall, a first conductive plate being disposed on the first trench wall and a second conductive plate being disposed on the second trench wall, the first and second conductive plates being insulated from the semiconductor substrate, whereby conductive material associated with the first and second plates enhances the capacitance associated with at least one of the first storage node and the second storage node.

2. The memory cell of claim 1 wherein the pull down transistors are laterally disposed on the portion of the semiconductor substrate, and the trench is an isolation trench disposed in the portion of the substrate, and wherein the conductive material is polysilicon.

3. The memory cell of claim 1 further comprising:
   a dielectric material disposed between the first conductive plate and the second conductive plate.

4. The memory cell of claim 1 wherein the first conductive plate is electrically coupled to a drain of the first pull down transistor and the second conductive plate is electrically coupled to a drain of the second pull down transistor.

5. The memory cell of claim 4 wherein the first and second conductive plates are insulated from the semiconductor substrate by a liner insulation material between the first trench wall and the first conductive plate disposed on the first trench wall and the between the second trench wall and the second conductive plate disposed on the second trench wall.

6. The memory cell of claim 5 wherein the first conductive plate and the second conductive plate forms a coupling capacitor between the first storage node and the second storage node, and wherein the first conductive plate and the portion of the substrate form a first substrate capacitor between the portion of the substrate and the first pull down transistor, and wherein the second conductive plate and the portion of the substrate form a second substrate capacitor between the portion of the substrate and the second pull down transistor.

7. A flip-flop based memory cell comprising:
   a first lateral pull down transistor formed on a semiconductor substrate, the first lateral pull down transistor having a first source region disposed on a top side of the semiconductor substrate, a first drain region disposed on the top side of the semiconductor substrate, and a first gate disposed on the top side of the semiconductor substrate and between the first drain region and the first source region;
   a second lateral pull down transistor formed on the semiconductor substrate, the second lateral pull down transistor having a second source region disposed on the top side of the semiconductor substrate, and a second gate disposed on the top side of the semiconductor substrate, a second gate disposed on the top of the semiconductor substrate and between the second drain region and the second source region;
   wherein the first lateral pull down transistor is positioned adjacent the second lateral pull down transistor and the first lateral pull down transistor is separated from the second lateral pull down transistor by a trench formed in the semiconductor substrate;
   wherein said memory cell includes a capacitive structure formed in said trench;
   wherein the trench includes a plurality of sidewalls, the sidewalls being covered by a liner oxide; and
   wherein the capacitive structure is a two plate structure consisting essentially of the liner oxide on a first side wall of the sidewalls of the trench being covered by a first polysilicon and the liner oxide on a second sidewall of the sidewalls of the trench being covered by a second polysilicon, the first and second polysilicon being insulated from the semiconductor substrate, the capacitive structure storing charge between the first polysilicon and the second polysilicon.

8. The memory cell of claim 7 wherein the trench is an isolation trench disposed between the first drain region and the second drain region.

9. The memory cell of claim 7 further comprising:
   a dielectric material disposed between the side walls.

10. The memory cell of claim 7 wherein the first polysilicon within the trench is electrically coupled to the first drain of the first lateral pull down transistor.

11. The memory cell of claim 7 wherein the cell is a static random access memory cell.

12. A flip-flop based static random access memory cell with enhanced capacitance, the memory cell comprising:
   a first N-channel lateral pull down transistor formed on a semiconductor substrate, the first lateral pull down transistor having a first source/drain region disposed on a top side of the semiconductor substrate, a second source/drain region disposed on the top side of the semiconductor substrate, and a first gate disposed on the top side of the semiconductor substrate and between the first source/drain region and the second-source/drain region;

a second N-channel lateral pull down transistor formed on the semiconductor substrate, the second lateral pull down transistor having a third source/drain region disposed on the top side of the semiconductor substrate, a fourth source/drain region disposed on the top side of the semiconductor substrate, and a second gate disposed on the top side of the semiconductor substrate and between the third source/drain region and the fourth source/drain region; and wherein the first lateral pull down transistor is positioned adjacent the second lateral pull down transistor and the first source/drain region is separated from the third source/drain region by an isolation trench formed in the semiconductor substrate, and wherein said memory cell includes a two-plate capacitor formed in said trench, wherein the trench includes a first sidewall and second sidewall, the first sidewall covered by a first liner oxide and a first conductive material, the second sidewall covered by a second liner oxide and a second conductive material to thereby form the capacitor wherein charge is stored between the first conductive material and the second conductive material.

13. The memory cell of claim 12, wherein the first and second conductive material and the first and second gate are the same type of material.

14. The memory cell of claim 13, wherein the first and second conductive material include polysilicon.

15. The memory cell of claim 12, further comprising:
a strapping layer coupled to the first source/drain region and the first conductive material.

16. The memory cell of claim 15, wherein a second strapping layer connects the second conductive material to the third source/drain region.

17. The memory cell of claim 12, wherein a dielectric material is disposed between the first conductive material and the second conductive material.

18. The memory cell of claim 12, wherein the trench has a bottom, the bottom being covered by a bottom liner oxide.

19. The memory cell of claim 12 wherein the capacitor provides capacitance between a first storage node and a second storage node of the memory cell, between the first drain/source region and ground, and between the third drain/source region and ground.

* * * * *